(12) United States Patent
Choi

(10) Patent No.: US 11,972,976 B2
(45) Date of Patent: Apr. 30, 2024

(54) PLANARIZATION SYSTEM, PLANARIZATION PROCESS, AND METHOD OF MANUFACTURING AN ARTICLE

(71) Applicant: CANON KABUSHIKI KAISHA, Tokyo (JP)

(72) Inventor: Byung-Jin Choi, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 189 days.

(21) Appl. No.: 17/244,778

(22) Filed: Apr. 29, 2021

(65) Prior Publication Data
US 2022/0352014 A1 Nov. 3, 2022

(51) Int. Cl.
| | |
|---|---|
| *H01L 21/768* | (2006.01) |
| *B29C 35/08* | (2006.01) |
| *H01L 21/02* | (2006.01) |
| *H01L 21/3105* | (2006.01) |
| *H01L 21/67* | (2006.01) |

(52) U.S. Cl.
CPC .. *H01L 21/76825* (2013.01); *H01L 21/02348* (2013.01); *B29C 2035/0827* (2013.01); *H01L 21/31051* (2013.01); *H01L 21/67115* (2013.01)

(58) Field of Classification Search
CPC ......... H01L 21/02348; H01L 21/31051; H01L 21/67115; H01L 21/76825; H01L 21/7684; B29C 2035/0827
See application file for complete search history.

(56) References Cited

U.S. PATENT DOCUMENTS

| | | | |
|---|---|---|---|
| 7,677,877 B2 | 3/2010 | Wuister et al. | |
| 8,237,133 B2 | 8/2012 | Ganapathisubramanian | |
| 10,754,078 B2 | 8/2020 | Bamesberger | |
| 2004/0134603 A1* | 7/2004 | Kobayashi | B29C 65/4845 156/64 |
| 2009/0317727 A1 | 12/2009 | Beck | |
| 2010/0090130 A1* | 4/2010 | Ganapathisubramanian | G03F 9/7042 250/492.1 |
| 2013/0078820 A1* | 3/2013 | Mikami | H01L 21/3086 264/447 |

(Continued)

FOREIGN PATENT DOCUMENTS

| | | |
|---|---|---|
| JP | 2009266901 A | 11/2009 |
| JP | 4928963 B2 | 5/2012 |

*Primary Examiner* — Dah-Wei D. Yuan
*Assistant Examiner* — Stephen A Kitt
(74) *Attorney, Agent, or Firm* — CANON U.S.A., INC. IP DIVISION

(57) ABSTRACT

A planarization system comprises a substrate chuck configured to hold a substrate, a superstrate chuck configured to hold a superstrate, a planarizing head configured to support the superstrate chuck, a positioning system configured to cause the superstrate to come into contact with formable material dispensed on the substrate to form a multilayer structure, the multilayer structure including the superstrate, a film of the formable material, and the substrate, and an annular light source disposed between an upper end of the planarizing head and the substrate chuck. The annular light source is configured to emit light onto an outer annular region of the multilayer structure without emitting the light onto an inner central region of the multilayer structure. The inner central region is located radially inward relative to the outer annular region.

18 Claims, 13 Drawing Sheets

(56) References Cited

U.S. PATENT DOCUMENTS

2015/0158242 A1* 6/2015 Iwasaki ............... B29C 59/002
425/174.4
2020/0307036 A1* 10/2020 Iwatani ............... B29C 43/021

* cited by examiner

PLANARIZATION SYSTEM, PLANARIZATION PROCESS, AND METHOD OF MANUFACTURING AN ARTICLE

BACKGROUND

Field of Art

The present disclosure relates to substrate processing, and more particularly, to planarization of surfaces in semiconductor fabrication.

Description of the Related Art

Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

In certain known planarization systems and methods, a curing step is performed by transmitting UV light radiation through a transparent superstrate chuck. Curing through the transparent superstrate chuck can result in non-uniform transmission of UV light radiation to formable material located at the edges of the substrate because of the structure of the superstrate chuck. In particular, the transparent superstrate chuck comprises geometric features such as recesses, lands and channels that cause non-uniform transmission of the UV passing through. Furthermore, high intensity peaks may occur at sharp edges of the superstrate chuck due to Fresnel diffraction at the edges of the geometric features, which can affect the uniformity. The non-uniformity transmission can lead to unsatisfactory curing performance. Thus, there is a need in the art for a planarization system and a method that prevent these disadvantages.

SUMMARY

A planarization system comprises a substrate chuck configured to hold a substrate, a superstrate chuck configured to hold a superstrate, a planarizing head configured to support the superstrate chuck, a positioning system configured to cause the superstrate to come into contact with formable material dispensed on the substrate to form a multilayer structure, the multilayer structure including the superstrate, a film of the formable material, and the substrate, and an annular light source disposed between an upper end of the planarizing head and the substrate chuck. The annular light source is configured to emit light onto an outer annular region of the multilayer structure without emitting light source onto an inner central region of the multilayer structure. The inner central region is located radially inward relative to the outer annular region.

A method of planarizing a substrate comprises dispensing formable material onto the substrate, contacting a superstrate held by a superstrate chuck with the formable material on the substrate, thereby forming a multilayer structure including the superstrate, a film of the formable material, and the substrate, releasing the superstrate from the superstrate chuck, and emitting light from an annular light source onto an outer annular region of the multilayer structure without emitting light onto an inner central region of the multilayer structure. The inner central region is located radially inward relative to the outer annular region.

A method of manufacturing an article comprises dispensing formable material onto a substrate, contacting a superstrate held by a superstrate chuck with the formable material on the substrate, thereby forming a multilayer structure including the superstrate, a film of the formable material, and the substrate, releasing the superstrate from the superstrate chuck, curing the film of the multilayer structure by a) emitting light from an annular light source onto an outer annular region of the multilayer structure without emitting light onto an inner central region of the multilayer structure, and b) emitting light from an additional light source onto the inner central region of the multilayer structure, and processing the cured film to make the article. The inner central region is located radially inward relative to the outer annular region.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure and are therefore not to be considered limiting of its scope, for the disclosure may admit to other equally effective embodiments.

While the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

Figure 1:
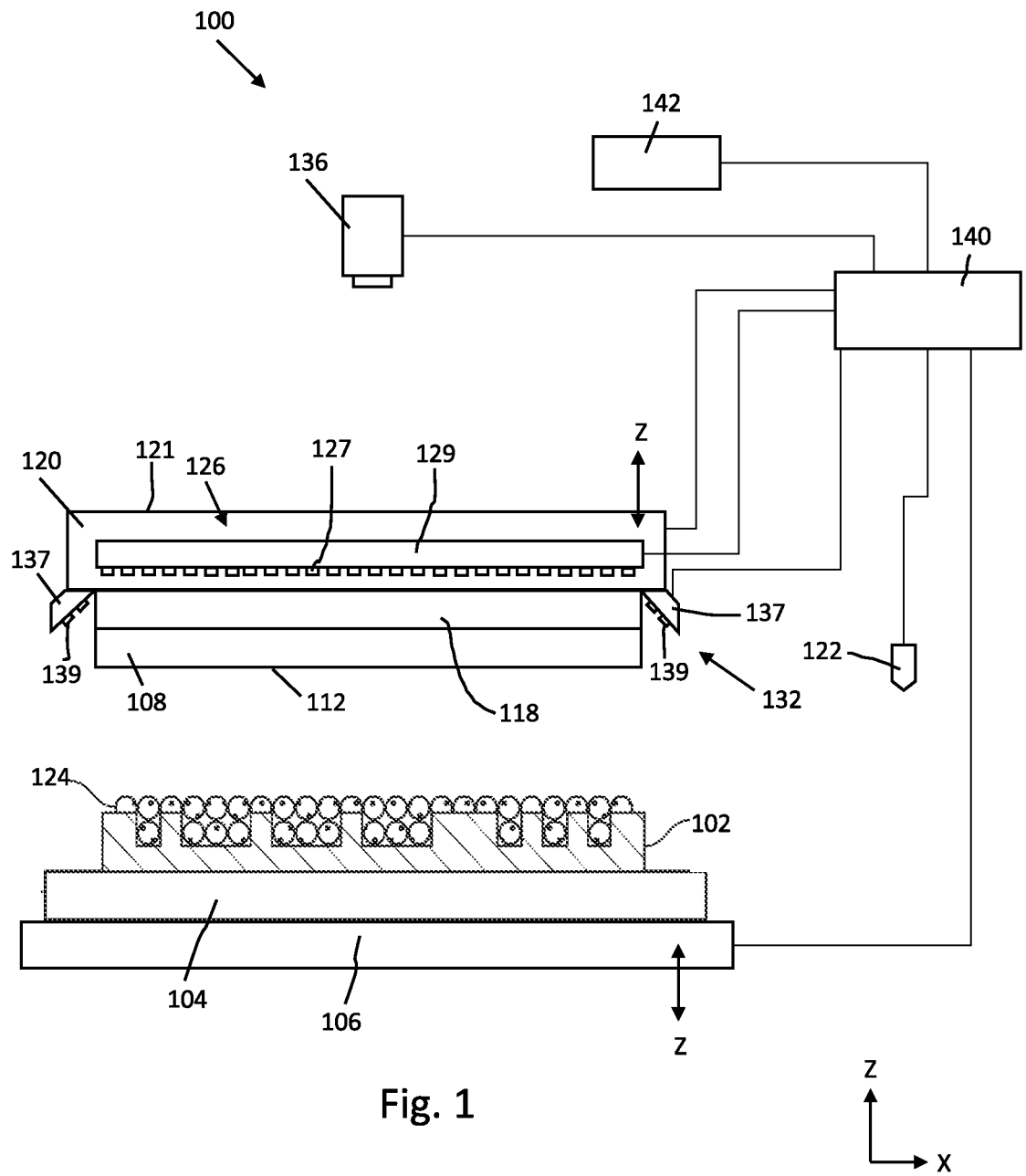
FIG. 1 is a schematic illustration of a cross section of an example planarization system in accordance with an aspect of the present disclosure.

FIG. 1 illustrates an example system for planarization in accordance with an aspect of the present disclosure. The planarization system 100 is used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of: the cartesian x-, y-, z-axes; and three tilt axes. The substrate positioning stage 106, the substrate 102, and the substrate chuck 104 may also be positioned on a base (not shown). The movement of the stage 106 may be controlled by a controller 140, discussed below. The combination of the features that provide for the relative movement and the controller for controlling the movement is referred herein as a positioning system.

The planarization system 100 may comprise a fluid dispenser 122. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

As shown in FIG. 1, the planarization system 100 may comprise a superstrate 108 having a working surface 112 facing and spaced apart from the substrate 102. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is transparent to UV light radiation. The surface 112 is generally of the same areal size as or slightly larger than the surface of the substrate 102.

The planarization system 100 may further include a superstrate chuck 118 and a planarization head 120. The superstrate 108 may be coupled to or retained by the superstrate chuck 118. As noted above, the transparent superstrate chuck may include geometric features such as recesses, lands, and channels that cause non-uniform transmission of the UV passing through it, especially when the recesses, lands, and channels are close to the focal plane of the UV light radiation. The superstrate chuck 118 may be coupled to the planarization head 120. The planarization head 120 may be movably coupled to a bridge (not shown). The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, and three tilt axes). The aspects of the planarization head that allow for this movement, as controlled by the controller 140, are also components of the positioning system. In operation, either the planarization head 120, the substrate positioning stage 106, or both vary a distance between the superstrate 108 and the substrate 102 to define a desired space (a bounded physical extent in three dimensions) that is filled with the formable material 124. For example, the planarization head 120 may be moved toward the substrate and may apply a force to the superstrate 108 such that the superstrate contacts and spreads droplets of the formable material 124 as further detailed herein. The same effect may also be achieved by moving the substrate 102 toward the superstrate 108, or both can be moved together.

The planarization system 100 may further comprise a camera 136 positioned to view the spread of formable material 124 as the superstrate 108 contacts the formable material 124 during the planarizing process. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The fluid dispenser 122 may be movably coupled to the bridge. In an embodiment, the fluid dispenser 122 and the planarization head 120 share one or more or all positioning components. The positioning components are part of the positioning system. In an alternative embodiment, the fluid dispenser 122 and the planarization head 120 move independently from each other. The fluid dispenser 122 and the planarization head 120 are moveable so that each can perform their respective functions without interfering with each other.

Figure 5A:
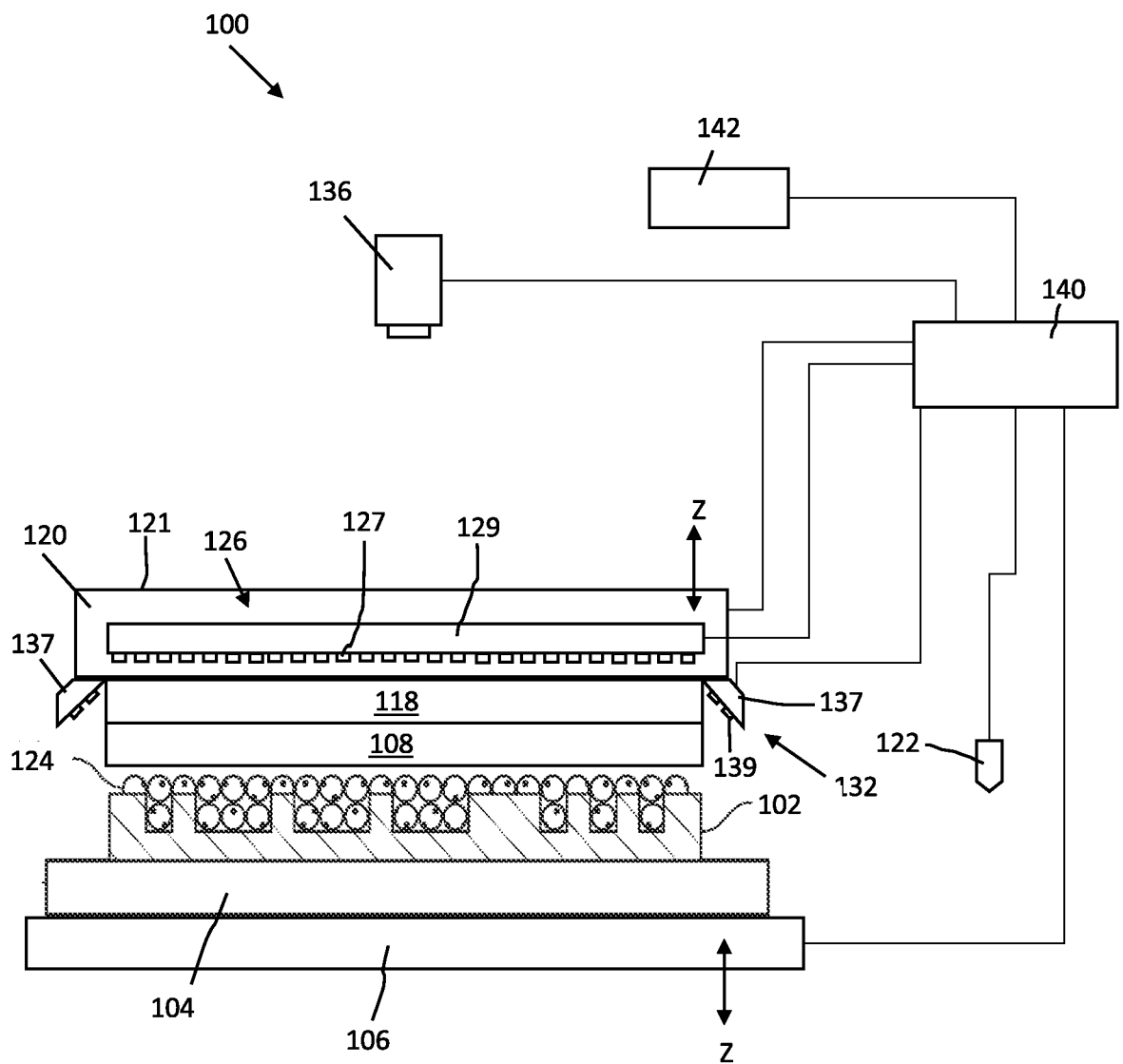
FIGS. 5A to 5E and 5H to 5J show schematic cross sections of the operation of the planarization system when performing the method of FIG. 4.
Figure 5B:
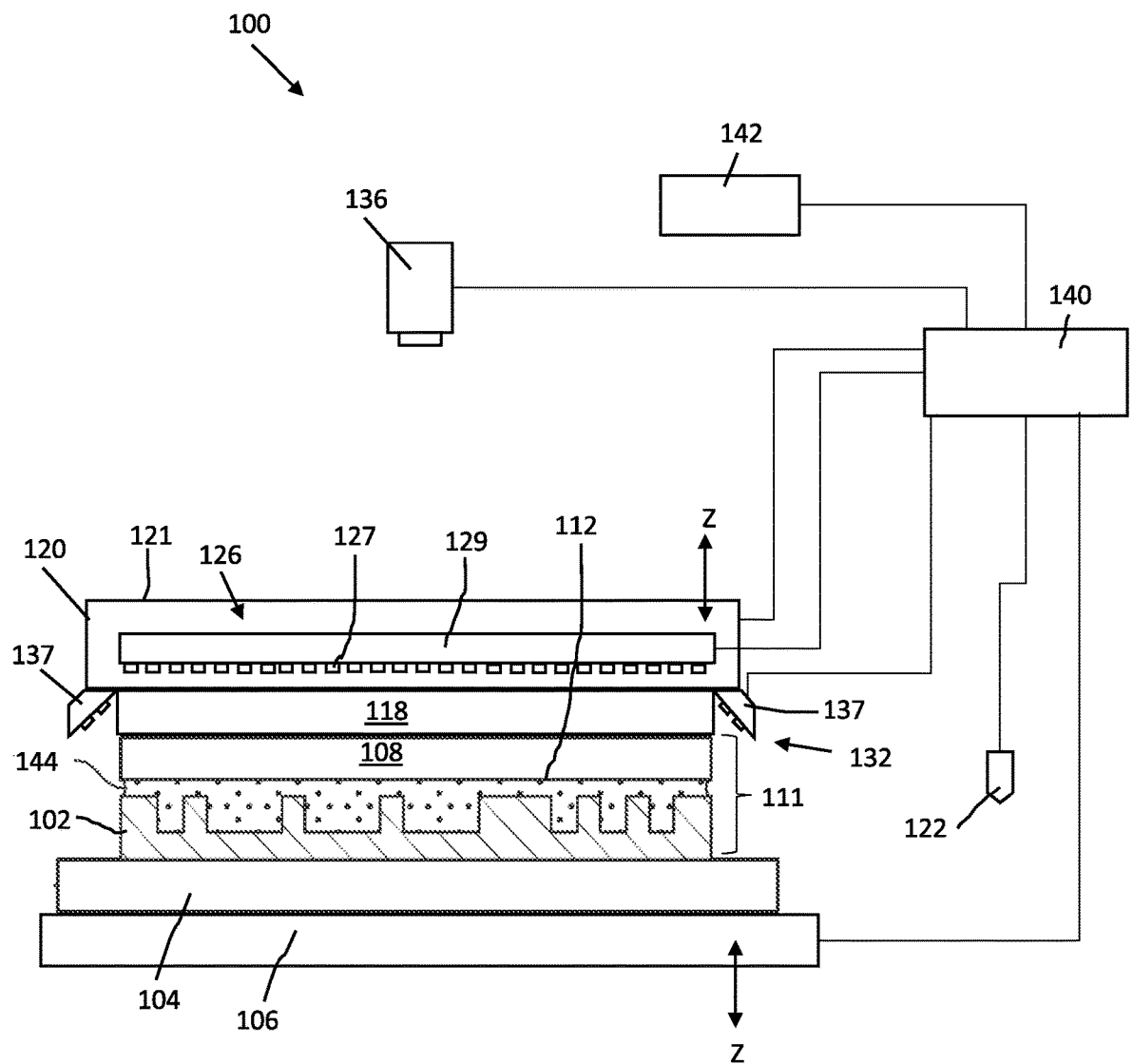
Figure 5C:
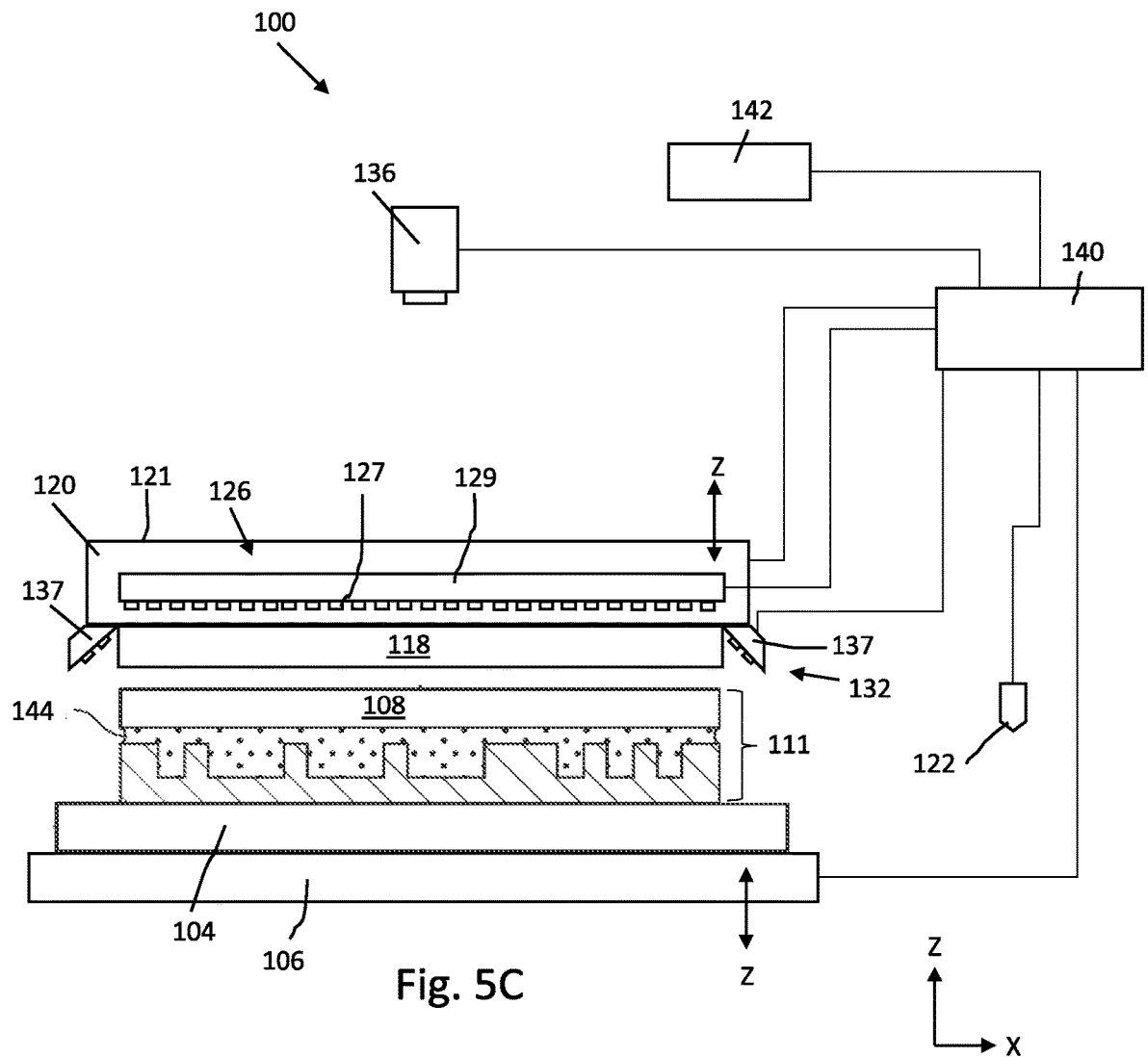
Figure 5D:
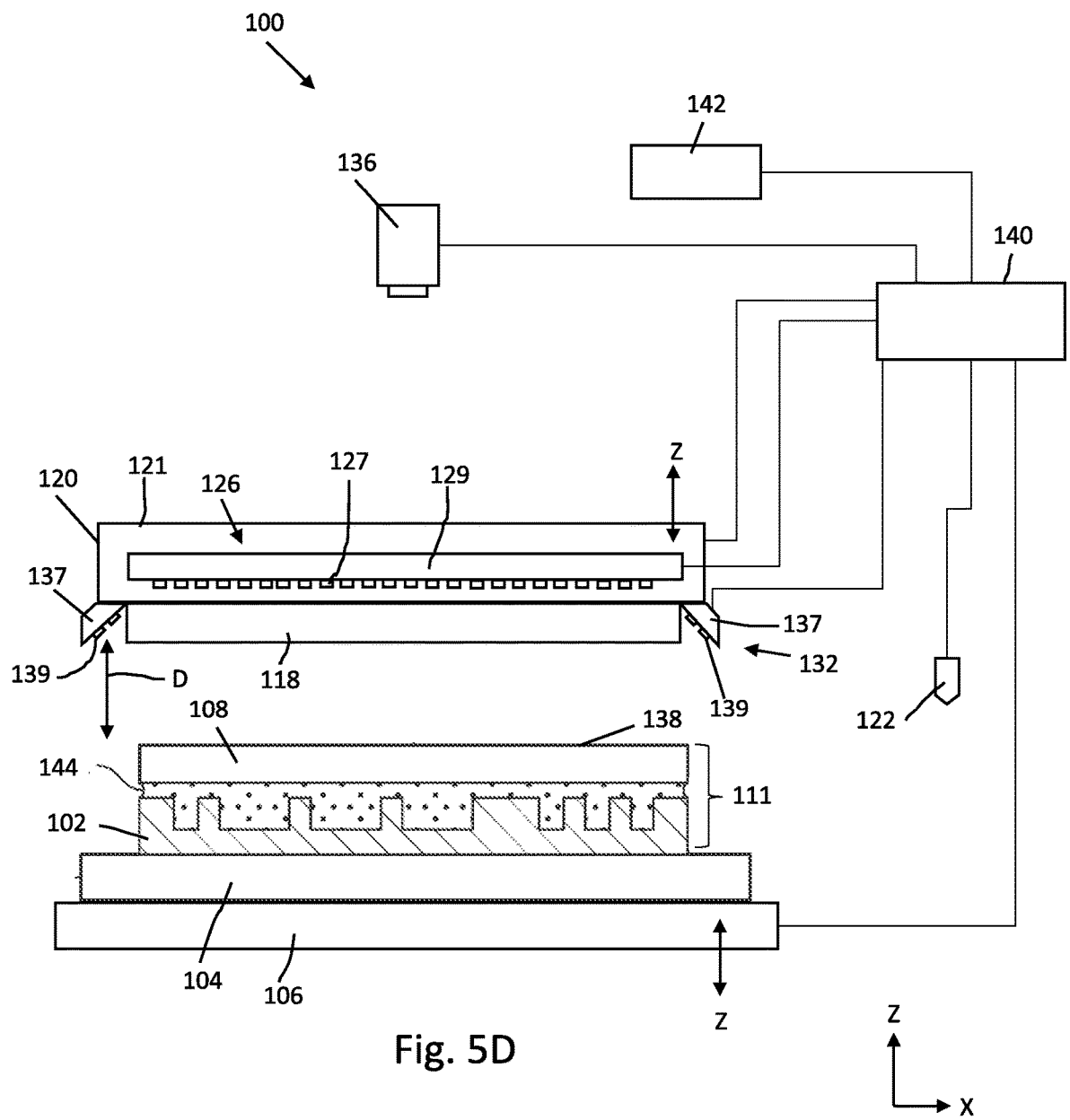
Figure 5E:
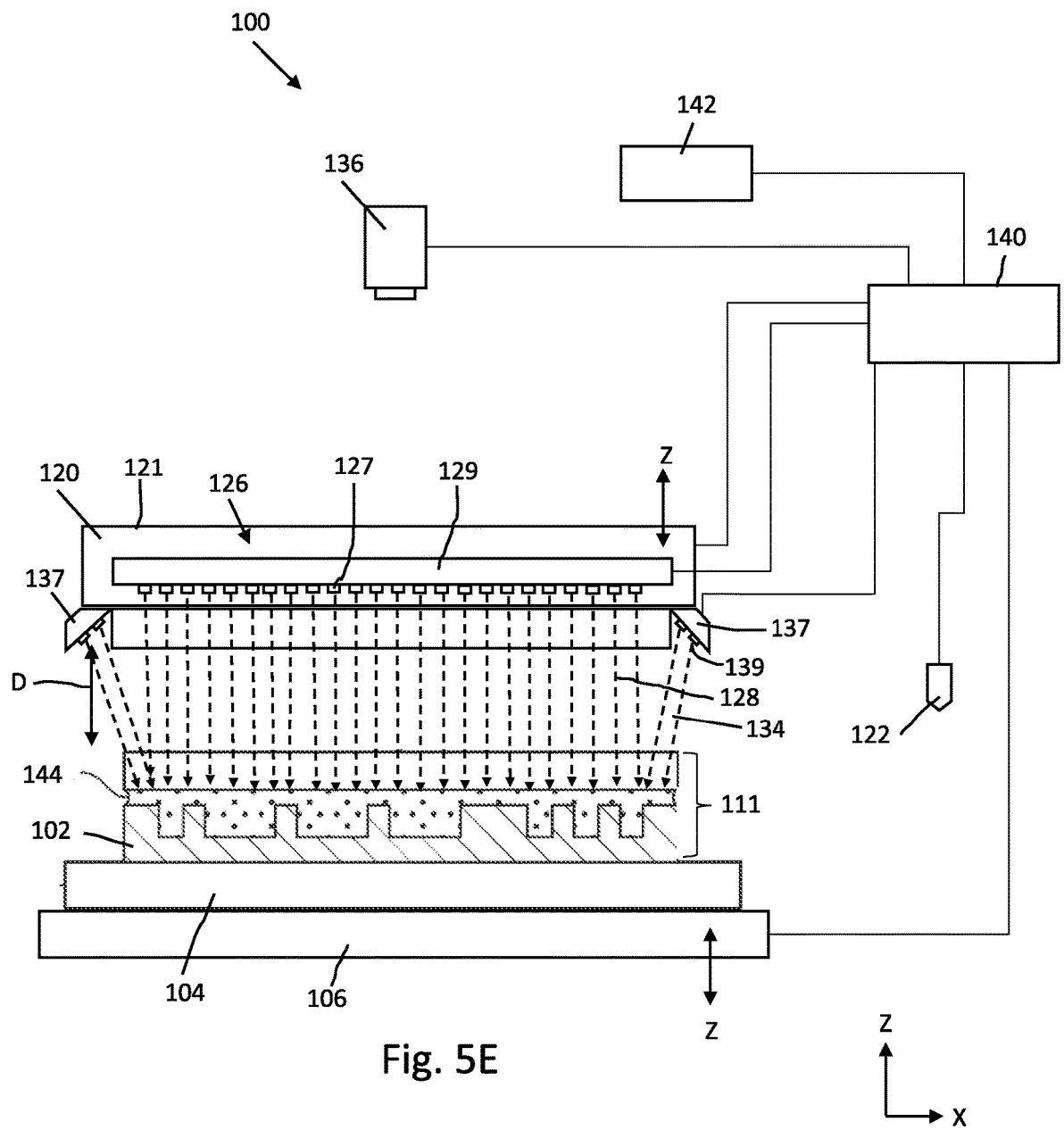

The planarization system 100 may include a first radiation source 126 (also referred herein as an additional light source) that directs actinic energy, for example, UV light radiation, along an exposure path 128 (FIG. 5E). The exposure path 128 passes through the transparent superstrate chuck 118. The transparent superstrate chuck comprises geometric features such as recesses, lands and channels that cause non-uniform transmission of the UV light radiation emitted by the first radiation source 126. There may also be non-uniform transmission of the UV light radiation emitted by the first radiation source 126 because high intensity peaks may occur at sharp edges of the superstrate chuck due to Fresnel diffraction at the edges of the geometric features.

Figure 2:
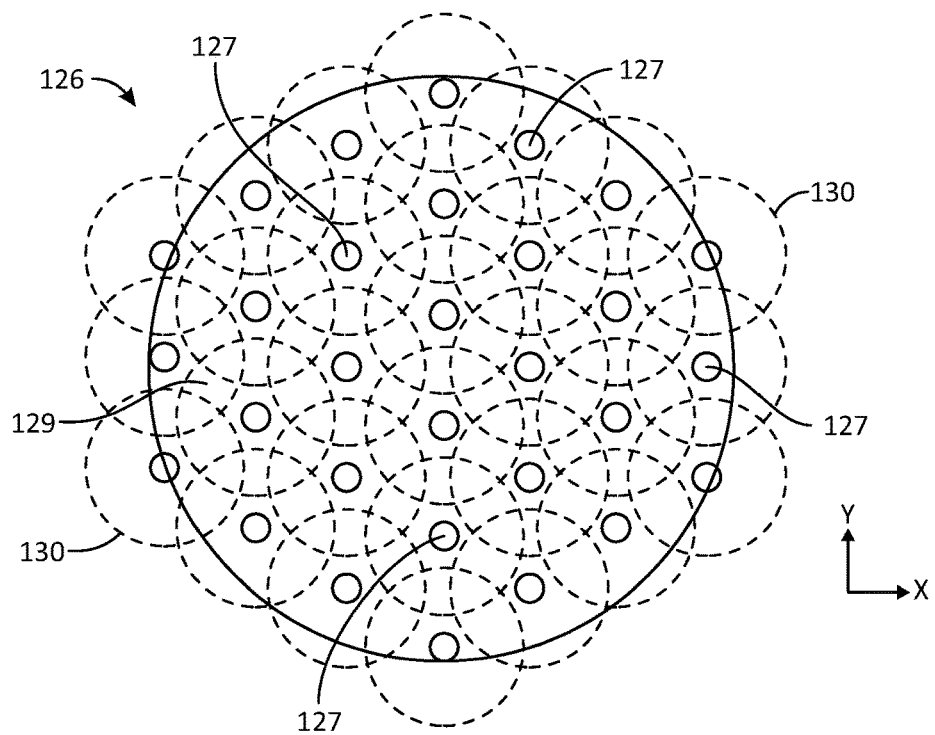
FIG. 2 is a schematic plan view of an example first radiation source including an array of light emitting diodes.

In one example embodiment the first radiation source 126 comprises an array of light emitting diodes (LEDs) 127 mounted on a support 129. FIG. 2 shows a schematic plan view of an example first radiation source 126 including an array of light emitting diodes 127. As shown in FIG. 2, the LEDs 127 may be arranged linearly on the support 129. The support 129 may have a circular shape and be the same size or slightly larger than the substrate 102. FIG. 2 further shows an area of light coverage 130 for each of the LEDS 127. The first radiation source 126 may also include a diffuser (not shown). The diffuser may be positioned proximate the light output of the LEDs to assist in achieving a target uniformity. The wavelength of the light emitted may be 300 to 400 nm. In an alternative embodiment, one or more sensors of the camera 136 may be integrated with the LEDS 127 of the first radiation source. In another alternative embodiment, an optical combiner (not shown) may be used to direct light from the radiation source 126 through the superstrate 108 while allowing light from the substrate 102 to be gathered by the camera 136.

As shown in FIG. 1, the first radiation source 126 may be mounted within the planarization head 120. Such an arrangement reduces the overall space required by the planarization system 100. Furthermore, for the array of LEDs 127 to be most effective, the array of LEDs 127 should be close to the surface of the formable material 124 being cured. However, in some instance it may be adequate for the array of LEDs 127 to be located above the planarization head 120. The array of LEDs 127 of the first radiation source may be directed downwardly such that the LEDs 127 are not angled (FIG. 5G) relative to a vertical line 145 (FIG. 5G), i.e., a line in the Z direction. More particularly, the center of the beam emitted by each of the LEDs 127 travels in a vertical line parallel to the Z direction. In other words, the angle of the center of the beam emitted by each of the LEDs 127 is 0° relative to the vertical line 145.

In another example embodiment, instead of the first radiation source 126 comprising an array or group of LEDs 127, the first radiation source 126 may comprise optical components, e.g., dichroic mirrors, beam combiners, prisms, lenses, mirrors, etc., to direct light from above the planarization head 120. That is, in another embodiment, the radiation (light) may originate form a source located well above the planarization head (i.e., above an upper end 121 of the planarization head) and the radiation may be directed through the planarization head and through the superstrate resulting in the same exposure pattern of the array of LEDs of the illustrated embodiment. In such a case, the radiation source may comprise a mercury bulb or mercury-xenon for example. Light emitted from a bulb type source that is directed using optical component, as opposed to an array of LEDs, can still provide sufficient energy to cure the formable material even though the bulb is located much farther away from the formable material 124. When a bulb type source is used, it is located well above the planarization head 120 so that the heat produced does not impact the materials.

Figure 3:
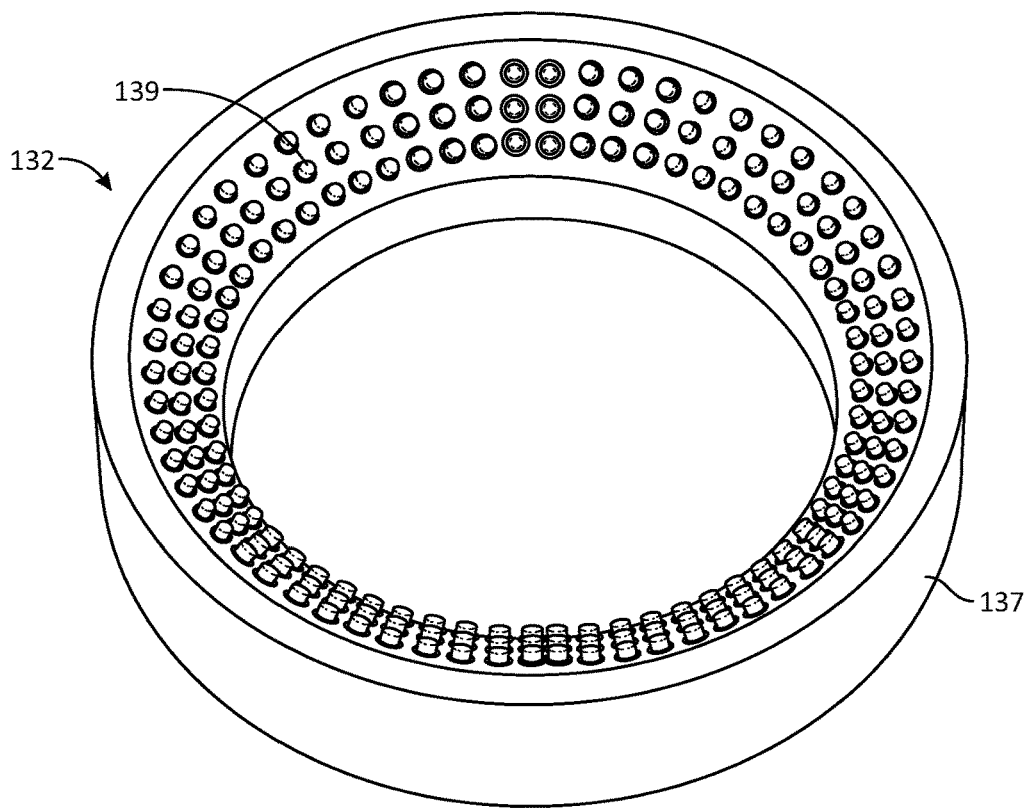
FIG. 3 is a perspective view of an example second radiation source including an array of light emitting diodes.
Figure 5F:
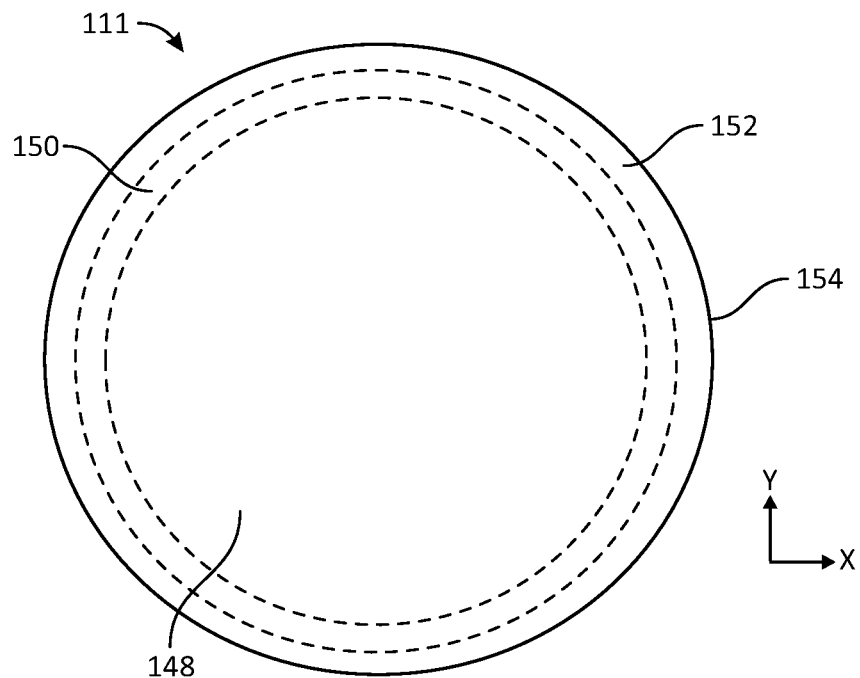
FIG. 5F is a schematic plan view of a multilayer structure during a curing step.
Figure 5G:
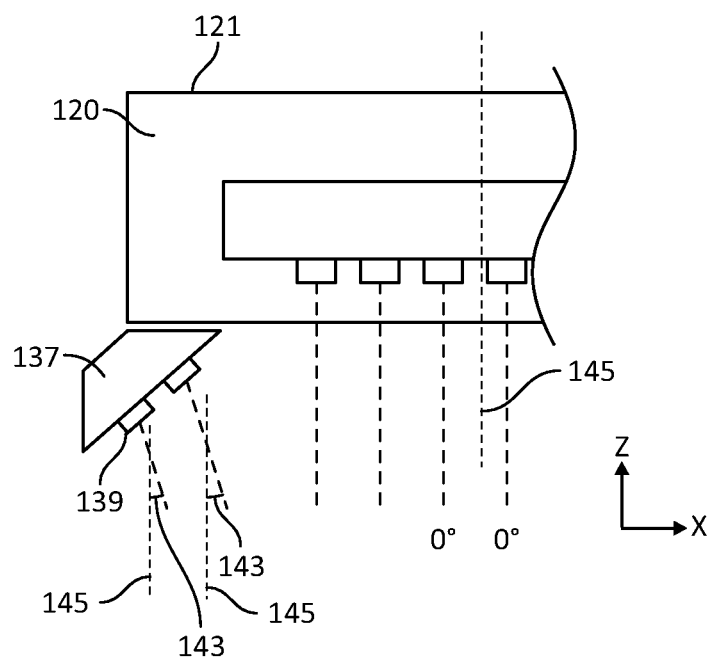
FIG. 5G is a close-up view of a portion of the example second radiation source including an array of light emitting diodes.

The planarization system 100 further includes a second radiation source 132 (also referred herein as an annular light source) that directs actinic energy, for example, UV light radiation, along an exposure path 134 (FIG. 5E). The second radiation source 132 may be located below the upper end 121 of the planarization head 120 and above the substrate 102. The second radiation source 132 may be mounted to the planarization head 120 or the superstrate chuck 118. The second radiation source 132 may also be independently supported. In one example embodiment the second radiation source 132 comprises an array of light emitting diodes (LEDs) 139 mounted on an annular support 137. That is, the second radiation source 132 is an annular light source. FIG. 3 shows a perspective view of an example second radiation source 132 including a support 136 and an array of light emitting diodes 139. As shown in FIG. 3, the support 137 may be an annular ring with the LEDs 139 being angled. The angle of the LEDs 139 is shown schematically in cross section in FIGS. 1, 5A to 5E, and 5H to 5J. As seen in FIG. 3, the second radiation source 132 is symmetrical the center point of the annular support 137. Thus, the schematic cross section view of the second radiation source 132 shown in FIGS. 1, 5A to 5E, and 5H to 5J is the same no matter what line the cross section is taken along, as long as the cross section line passes through the center point of the annular support 137. FIG. 5G is a close-up view of a portion of the cross section of the example second radiation source 132 including an array of light emitting diodes 139. As best seen in FIG. 5G, from the cross section view, the angle 143 of the light emitting diodes 139 can be defined as the angle relative to a vertical line 145 along the Z-axis. More particularly, the angle 143 of the LEDs 139 may be defined as the angle of the center beam emitted by a particular LED relative to a vertical line 145 along the Z-axis. For example, the angle 143 of center beam emitted from one of the LEDs relative to a vertical line 145, i.e., along the Z-axis direction, may be from 30 to 60 degrees.

Because the support 137 is an annular ring, and because the LEDs mounted thereon are angled, the light emitted from the LEDs may directed toward an outer annular region of the formable material, which is discussed below. That is, the array of LEDs 139 may be configured such that the emitted light is distributed across the outer annular region of the substrate 102. The second radiation source 132 may also include a diffuser (not shown). The diffuser may be positioned proximate the light output of the LEDs to assist in achieving the target uniformity. The wavelength of the light emitted may be 300 to 410 nm.

The planarization system 100 may be regulated, controlled, and/or directed by one or more processors 140 (controller) in communication with one or more components and/or subsystems such as the substrate chuck 104, the substrate positioning stage 106, the superstrate chuck 118, the fluid dispenser 122, the planarization head 120, the camera 136, the radiation source 126. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the method steps described herein may be executed by the processor 140. As noted above, the features that provide for movement and control of the movement for the various components of the system are a positioning system.

Planarization Method

Figure 4:
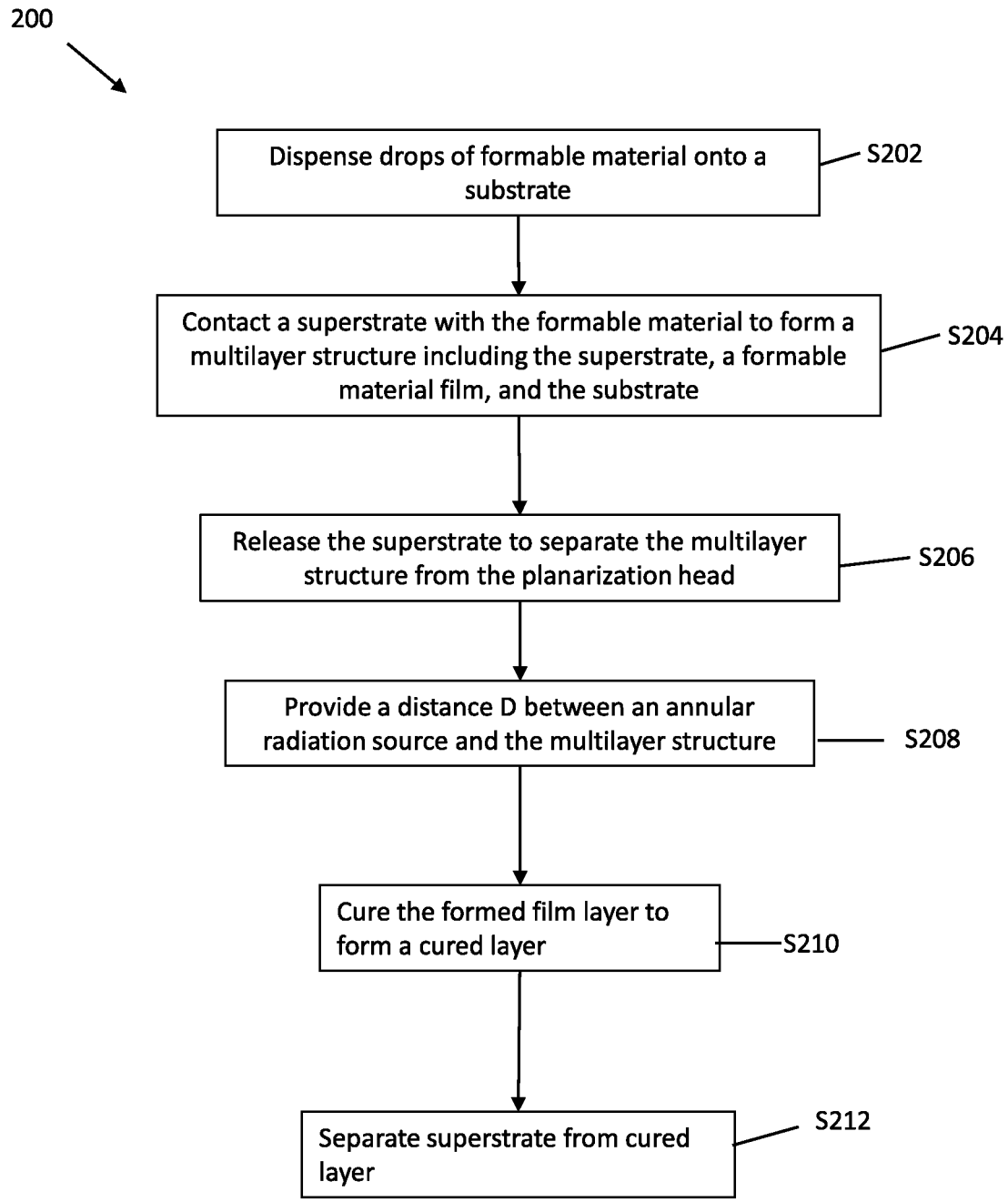
FIG. 4 is a flow chart of a planarization method in accordance with an example embodiment.

FIG. 4 shows a flow chart of a planarization method 200 in accordance with an example embodiment. FIGS. 5A to 5E and 5H to 5J show schematic cross sections of the operation of the planarization system 100 when performing the method 200. The planarization method 200 may begin with step S202, where formable material 124 is dispensed onto the substrate 102 in the form of droplets. As discussed above, the substrate 102 surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The step S202 may be performed using the dispenser 122 either at the same location as the planarizing head 120 or at another location by carrying the substrate 102 to a dispensing location. FIG. 1 shows the substrate 102 after the formable material has been dispensed. FIG. 5A shows a schematic cross section of the substrate 102 just before the superstrate 108 comes into contact with formable material 124, i.e., after the completion of step S202 and just before step S204. That is, at the moment shown in FIG. 5A, the superstrate 108 is being held by the superstrate chuck 118 and has not yet come into contact with the formable material 124. In order to reach the position shown in FIG. 5A, at least one of the planarization head 120 and the stage 106 is moved in the Z direction using the positioning system such that the distance between the planarization head 120 and the substrate 102 with formable material 124 is reduced. Preferably, only one of the planarization head 120 and stage 106 is moved in the Z direction, while the other is stationary. In a preferred embodiment planarization head 120 moves downwardly in the Z direction while the stage 106 remains stationary. However, in some instances both may be moved.

The planarization method 200 may then proceed to step S204, where the substrate 102 having the formable material 124 is planarized using the planarizing head 120 to form a multilayered structure 111. As noted above, using the positioning system, the planarization head 120 may be moved toward the substrate 102 to apply a force to the superstrate 108 such that the superstrate 108 contacts and spreads droplets of the formable material 124. FIG. 5B illustrates a post-contact step after the superstrate 108 has been brought into full contact with the formable material 124. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. In an embodiment, the superstrate 108 and/or the substrate 102 is supported by a controlled back pressure from the substrate chuck 104 and/or superstrate chuck 118 to make the formable material 124 spread without trapping voids. The spreading starts from the center of the substrate 102 and ends at the boundary of the active area of the substrate 102. At the moment shown in the FIG. 5B, the step S204 has been completed. Furthermore, at this moment, while the superstrate 108 is still in contact with the formable material 124, a multilayer structure 111 has been formed. In particular, the multilayer structure 111 comprises or consists of the superstrate 108, the formable material film 144, and the substrate 102, in that order. In another aspect, the multilayer structure may also be considered to comprise or consist of the superstrate 108, the formable material film 144, the substrate 102, and the substrate chuck 104, in that order. In either case, as shown in FIG. 5B, in the multilayer structure 111, the underside surface 112 of the superstrate 108 is in direct contact with the upper surface of the formable material film 144, while the underside surface of the formable material film 144 is in direct contact with the upper surface of the substrate 102.

The method may then proceed to step S206, where the superstrate 108 is released from the superstrate chuck 118 while the superstrate 108 is still in contact with the formable material film 144. FIG. 5C shows a schematic cross section of the planarization system 100 just after release of the superstrate 108. This action of releasing the superstrate 108 from the superstrate chuck 118 leaves the multilayer structure 111 free from the planarization head 120. The releasing of the superstrate 108 from the superstrate chuck 118 may also be referred to as dechucking. Thus, as a result of releasing the superstrate 108 from the superstrate chuck 118, the multilayer structure 111 (i.e., the superstrate 108, the formable material film 144, and the substrate 102 in that order) remains in contact only with the substrate chuck 104.

The method may then proceed to step S208 where the positioning system is used to provide a distance D (FIG. 5D) between the second radiation source 132 and the multilayer structure 111. More particularly, the distance D is the distance between the second radiation source 132 and the upper surface 138 of the superstrate 108 in the Z direction. The distance D and angle 143 of the light emitted from the second radiation source 132 are selected such that the light reaches the outer annular region 152 of the multilayer structure 111. That is, the angle of the LEDs 139 of the second radiation source 132 and the distance D may be selected in combination such that the light emitted is directed to the outer annular region 152 of the multiplayer structure 111. The distance D may be 10 mm to 60 mm, preferably 20 mm to 40 mm. A ratio of the distance D to a diameter of the superstrate may be 1:8 to 1:30, preferably 1:5 to 1:15.

In a case that the second radiation source 132 is coupled with the superstrate chuck 118 or the planarization head 120, the distance D may be provided by using the positioning system to move at least one of the planarization head 120 and the stage 106 in the Z direction until the distance D between the second radiation source 132 and the superstrate 108 is reached. As noted above, preferably, only one of the planarization head 120 and stage 106 is moved in the Z direction, while the other is stationary. In a preferred embodiment planarization head 120 moves upwardly in the Z direction while the stage 106 remains stationary. In a case where the second radiation source 132 is not coupled with the superstrate chuck 118 or not otherwise carried by the planarization head 120 such that the second radiation source 132 is stationary in the Z direction, the stage 106 preferably is lowered in the Z direction until the distance D is reached. In another embodiment, the second radiation source 132 may be supported and movable in the Z direction independently of the planarization head 120, in which case the second radiation source 132 may also be moved in the Z direction along with one or both of the planarization head 120 and the stage 106 to achieve the distance D.

The method may then proceed to step S210, where the formed film layer 144 is cured, while maintaining the distance D between the multilayer structure 111 and the second radiation source 132. FIG. 5E shows a schematic cross section of planarization system 100 at a moment when the curing process has begun, while multilayer structure 111 at the distance D. FIG. 5F shows a schematic plan view of the multilayer structure 111 during the curing step. In particular, FIG. 5F illustrates three regions where the light of the first radiation source 126 and the second radiation source 132 contact the multilayer structure 111.

The polymerization process or curing of the formable material 124 may be initiated with actinic radiation (e.g., UV light radiation). For example, the first radiation source 126 and the second radiation source 132 provide the actinic radiation causing formable material film 144 to cure, solidify, and/or cross-link, defining a cured layer 146 on the substrate 102. More particularly, as shown in FIGS. 5E and 5F, the UV light radiation is emitted from the array of LEDs 127 of the first radiation source 126 and emitted from the array of LEDs 139 of the second radiation source 132 such that the emitted light is directed toward different regions of the multilayer structure 111. There are primarily three different regions as a result of the orientation and position of LEDs of the first radiation source 126 and the second radiation source 132. As noted above, the first radiation source 126 is directed such that the center of the light beam is directed downwardly, i.e., parallel to the Z direction. The array of LEDs 139 of the second radiation source 132 are angled and at the distance D such that the light is directed to an edge of the multilayer structure 111. This results in an inner central first region 148, an intermediate annular second region 150, and an outer annular third region 152, where the inner central first region 148 is located radially inward of the intermediate annular second region 150 and the intermediate annular second region 150 is located radially inward of the outer annular third region 152. Thus, the inner central region 148 is also located radially inward of the outer annular third region 152. The first region 148 is a region where the light emitted from the first radiation source 126 is sufficiently intense throughout the area to cure the film 144 within 20 seconds without light emitted from the second radiation source 132. In other words, the light emitted from the second radiation source 132 does not reach the first region 148 or if any light from the second radiation source 132 does reach the first region 148, it has such a low intensity that it has no curing effect on the film 146 in the first region 148. For example any light from the second radiation source 132 that does reach the first region 148 would have an intensity that is 20%% or less of the peak intensity. The light from the first radiation source 126 has an intensity that is 80% or more of the peak intensity in the first region 148.

The orientation and position of the first radiation source 126 and the second radiation source 132 further results in the intermediate annular second region 150. This second region is between the first region 148 and the outer third region 152 in a radial direction. In the second region both the light emitted from the first radiation source 126 and the second radiation source 132 are independently sufficient to cure the film 146 within the same curing time noted above. In other words, the intensity of the light from the first radiation source 126 and the intensity of the light from the second radiation source 132 are each independently sufficient to cure the area of the film 146 in the annular intermediate second region 150. For example, in the second region 150, the intensity of the light emitted from the first radiation source 126 is 50% or more of the peak intensity and the intensity of the light emitted from the second radiation source 132 is 50% or more of the peak intensity.

The orientation of the first radiation source 126 and the second radiation source 132 further results in the outer annular third region 152. This third region is radially outward of the intermediate annular second region 150. The third region 152 extends radially from the second region to the edge 154 of the multilayer structure 111. The third region 152 is a region where the light emitted from the second radiation source 132 is sufficiently intense throughout the area to cure the film 144 without light emitted from the first radiation source 126. In other words, the light emitted from the first radiation source 126 does not reach the third region 152 or if light from the first radiation source 126 does reach the third region 152 it has such a low intensity that it has no curing effect on the film 144 at the third region 152 within the same curing time noted above. For example any light from the first radiation source 126 that does reach the third region 152 would have an intensity that is 20% or less of the peak intensity. The light from the second radiation source 132 has an intensity that is 80% or more of the peak intensity in the third region 152.

As shown in FIG. 5F, the angle of the LEDs 139 and the distance D may be selected such that the area of the first region 148 may be many times larger than the area of second region 150 and the third region 152. For example, the ratio of the of the area of the first region to the area of the third region (i.e., first region area:third region area) may be 5:1 to 20:1 Furthermore, area of the second region 150 may be about the same as the area of the third region 152. Thus, the ratio of the of the area of the first region to the second region to the third region (i.e., first region area:second region area:third region area) may be 5:1:1 to 20:1:1, 1

Because the superstrate 108 is configured to be transparent with respect to the UV light radiation emitted from the array of LEDs 127 of the first radiation source 126 and the array of LEDs 139 of the second radiation source 132, the UV light radiation passes through the superstrate 108 and acts upon the formable material film 144 to cure the formable material film 144 resulting in the cured layer 146. Because the second radiation source 132 is present to direct light toward the edge of the multilayer structure 111 (i.e., to the third region 152), the above-noted non-uniform curing that occurs in other systems is avoided.

Figure 5H:
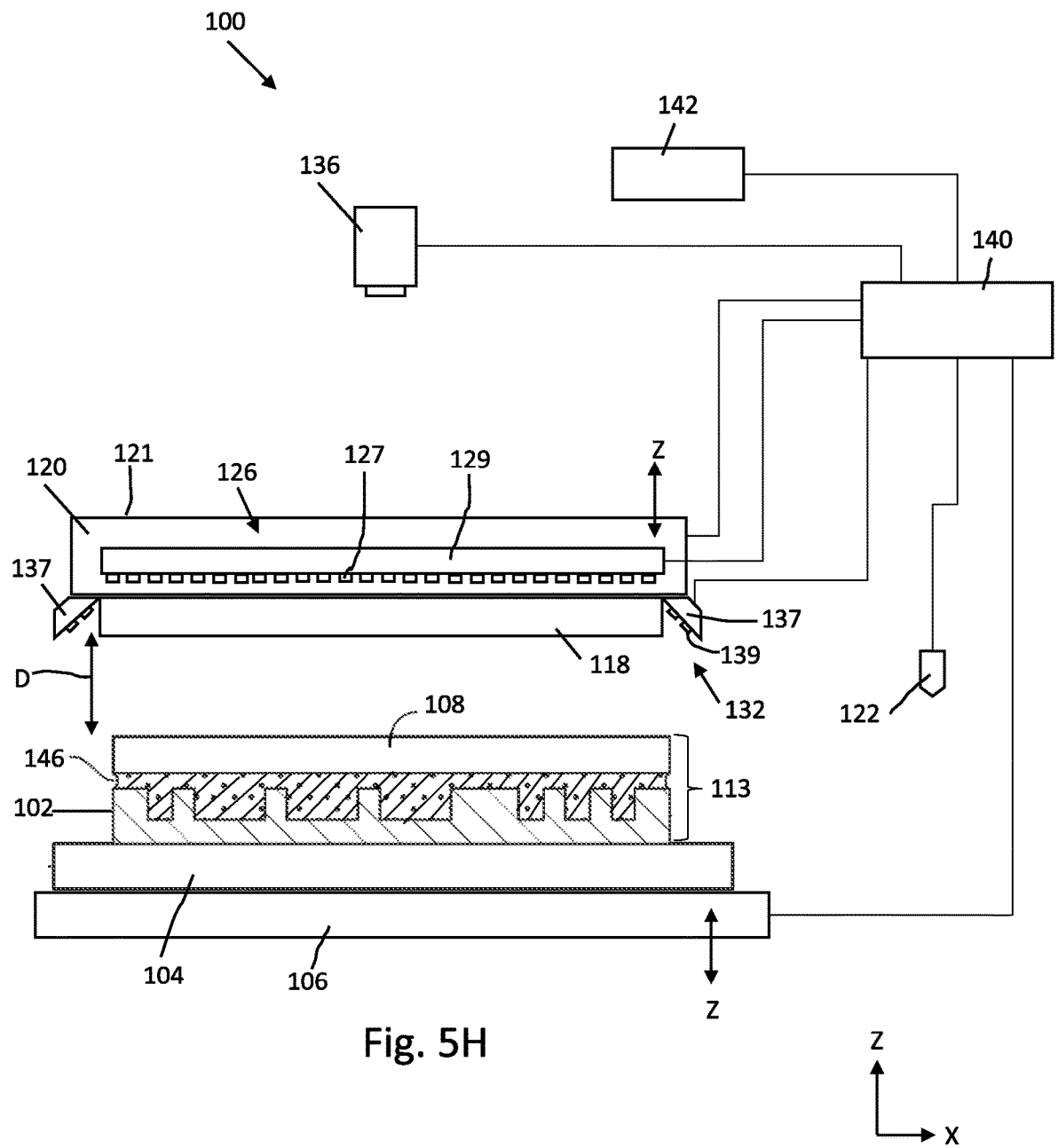
Figure 5I:
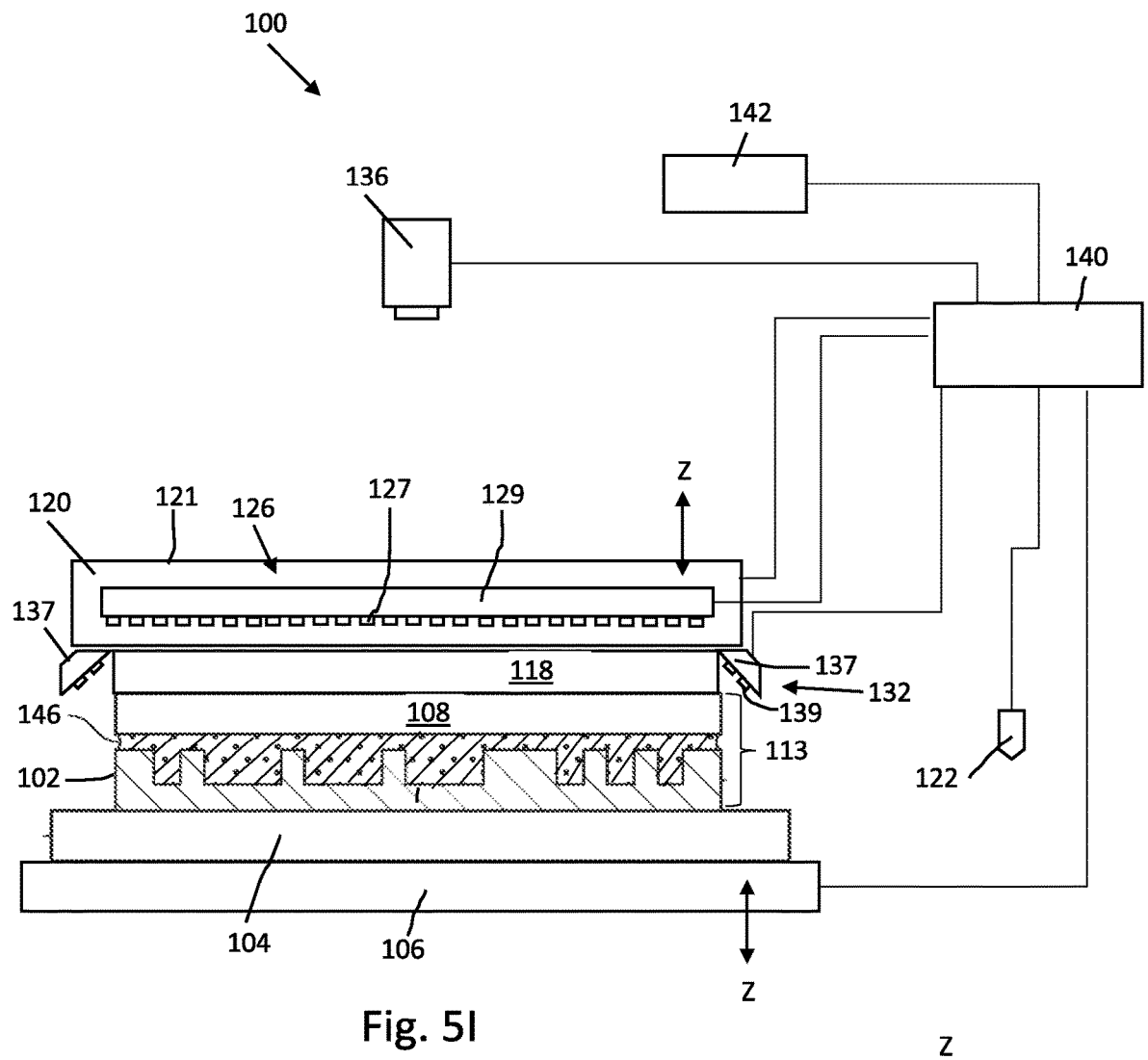

FIG. 5H shows a schematic cross section of planarization system 100 at a moment when the curing process in complete. As shown in FIG. 5H, when the curing process is complete, the formable material film 144 has become a cured layer 146. Likewise, the multilayer structure 111 has become a cured multilayer structure 113. The cured multilayer structure 113 is different from the multilayer structure 111 in that the multilayer structure 111 comprises the formable material film 144 between the superstrate 108 and the substrate 102, while the cured multilayer structure 113 comprises the cured layer 146 between the superstrate 108 and the substrate 102. In other words, the cured multilayer structure 113 comprises or consists of the superstrate 108, the cured layer 146, and the substrate 102, in that order. In another aspect, the cured multilayer structure 113 may also be considered to comprise or consist of the superstrate 108, the cured layer 146, the substrate 102, and the substrate chuck 104, in that order.

The planarization method 200 may then proceed to step S212, where the superstrate 108 is separated from the cured layer 146. To remove the superstrate 108 from the cured layer 146 the superstrate chuck 118 may be coupled once again to the superstrate 108 (i.e., rechucking the superstrate 108) via operation of the planarization head 120, while the superstrate 108 is still in contact with the cured layer 146. In order to couple the superstrate chuck 118 with the superstrate 108, at least one of the planarization head 120 and the stage 106 is moved using the positioning system in the Z direction until the superstrate chuck 118 comes into contact with the superstrate 108. Preferably, only one of the planarization head 120 and stage 106 is moved in the Z direction using the positioning system, while the other is stationary. In a preferred embodiment planarization head 120 moves downwardly in the Z direction while the stage 106 remains stationary. However, in some instances both may be moved.

Once the superstrate 108 is coupled with the superstrate chuck 118, the superstrate chuck 118 may begin to lift upwardly away from the substrate 102 by using the positioning system to move the planarization head 120 upwardly or using the positioning system to move the stage 106 downward in the Z direction. As noted above, both could also be moved. Because the superstrate 108 is coupled with superstrate chuck 118, the lifting force (or lowering force) will cause the superstrate 108 to separate from the cured layer 146.

Figure 5J:
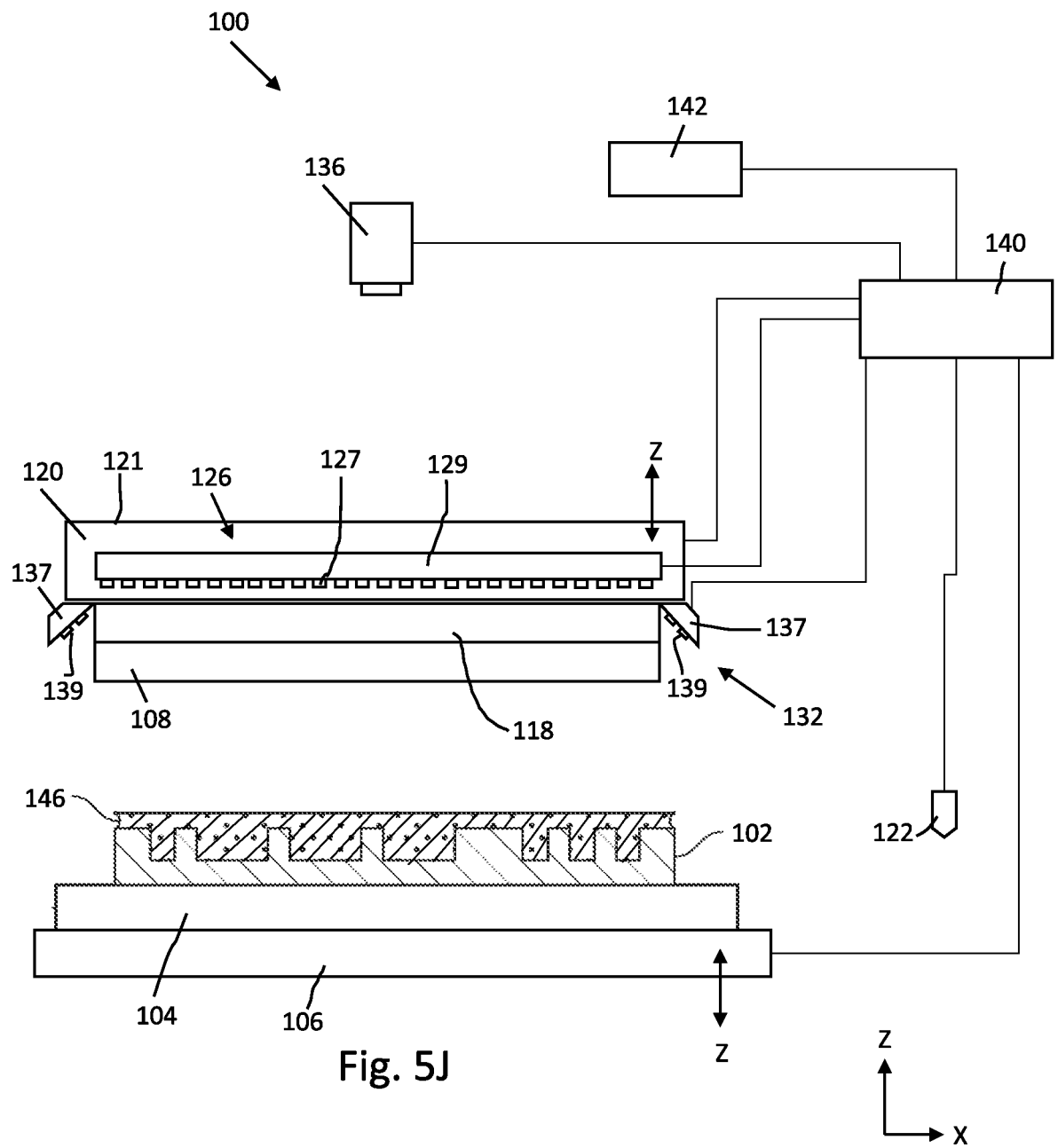

FIG. 5J shows a schematic cross section of planarization system 100 at a moment after the superstrate 108 has separated from the cured layer 146. As shown in FIG. 5J, at this moment, the superstrate 108 is once again in the starting position shown in FIG. 1, while the cured layer 146 is exposed on the substrate 102. The substrate 102 and the cured layer 146 may then be subjected to additional known steps and processes for device (article) fabrication, including, for example, patterning, curing, oxidation, layer formation, deposition, doping, planarization, etching, formable material removal, dicing, bonding, and packaging, and the like. The substrate 102 may be processed to produce a plurality of articles (devices). These additional steps may be performed by removing the substrate 102 having the exposed cured layer 146 from the housing 114 to a distinct location. Once the substrate 102, having the exposed cured layer 146, is removed, the planarization system 100 is ready to receive a new substrate with formable material and repeat the above process.

Figure 6:
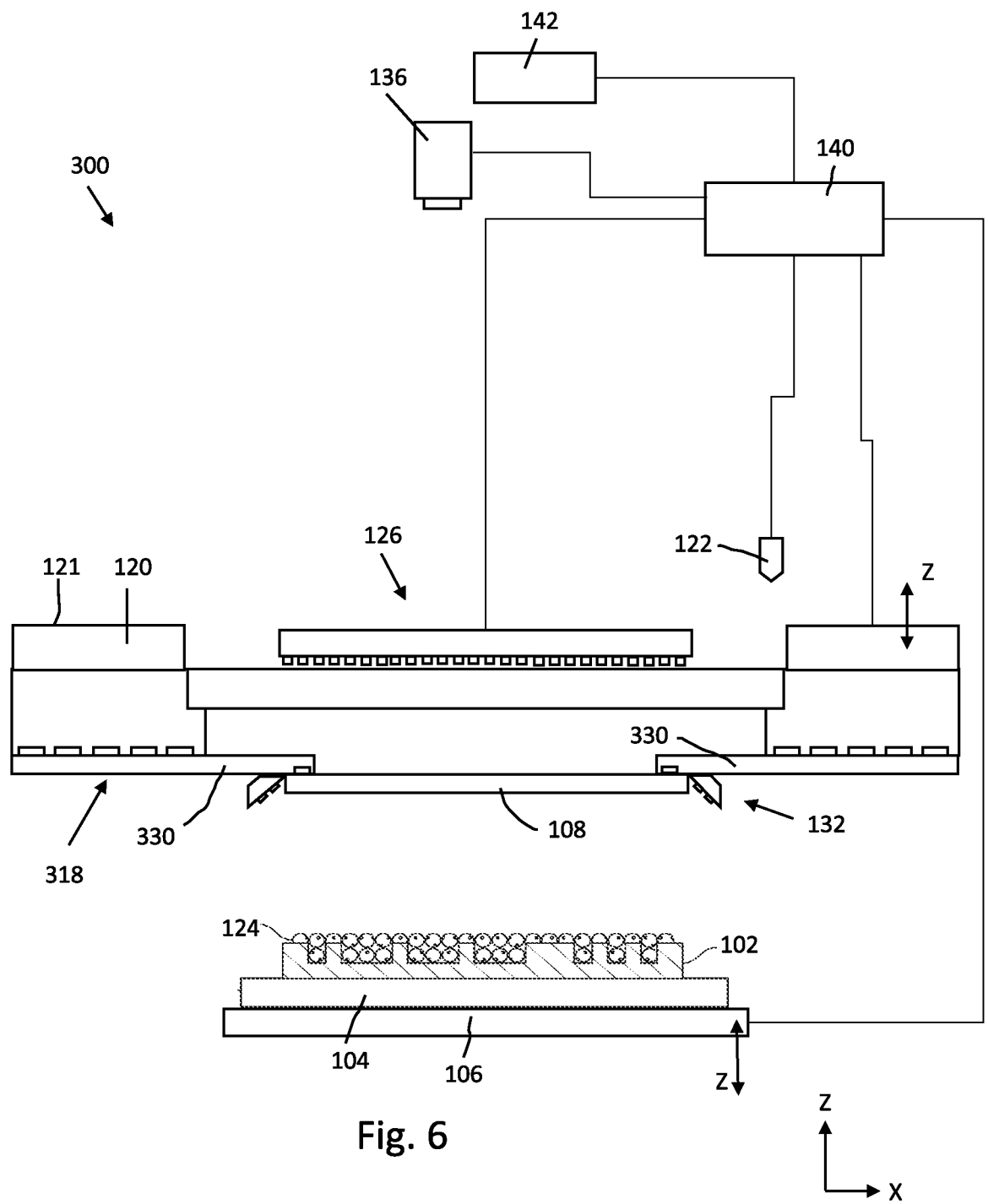
FIG. 6 is a schematic cross section of another example embodiment where a planarization system includes a superstrate chuck for holding the superstrate.

FIG. 6 shows a schematic cross section of another example embodiment where a planarization system 300 includes a superstrate chuck 318 for holding the superstrate 108. The planarization 300 is similar to the first embodiment except that the superstrate chuck 318 includes a flexible portion 330 that holds the superstrate 108. The details of the chuck assembly 318 can be found at U.S. application Ser. No. 17/069,614, entitled, "CHUCK ASSEMBLY, PLANARIZATION PROCESS, APPARATUS AND METHOD OF MANUFACTURING AN ARTICLE, filed Oct. 13, 2020 (hereinafter '614), which is expressly incorporated by reference herein in its entirety.

The planarization system 300 otherwise includes the same features discussed above with respect to the first embodiment, including the camera 136, the controller 140, the non-transitory computer memory 142, the dispenser 122, the planarization head 120, the first radiation source 126, the second radiation source 132, substrate 102 on which formable material 124 is dispensed, substrate chuck 104, and stage 106. As shown in FIG. 6 the first radiation source 126 may be similarly positioned above the superstrate 108 and substrate 104. That is, the first radiation source 126 may similarly emit light downwardly in the Z direction in the same manner as in the first embodiment.

As further shown in FIG. 6, the second radiation source 132 may be mounted to the flexible portion 330, more particularly to the underside of the flexible portion 330. Thus, the flexible portion 330 may serve dual functions. The first function is that described in the '614 application to hold the superstrate 118 during the planarization process. The second function is to support the second radiation source 132. The second radiation source 132 is the same as described above and include the same array of LED's at the same angle. In another embodiment, the second radiation source 132 may be independently supported below the flexible portion 330.

The process of performing the planarization method using the planarization system 300 is essentially the same as described in the first embodiment. The same steps set forth in FIG. 4, including providing the proper distance D between the second radiation source and the multilayer structure before curing. However, because the flexible portion 330 is included, the step of separating the superstrate from the cured layer would be as described in the '614 application.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A planarization system, comprising:
a substrate chuck configured to hold a substrate;
a superstrate chuck including a holding portion configured to hold a superstrate;
a planarizing head configured to support the superstrate chuck;
a positioning system configured to cause the superstrate to come into contact with formable material dispensed on the substrate to form a multilayer structure, the multilayer structure including the superstrate, a film of the formable material, and the substrate; and
an annular light source disposed between the holding portion of the superstrate chuck and the substrate chuck, the annular light source including an array of angled light emitting diodes,
wherein the annular light source is configured to emit light onto an outer annular region of the multilayer structure without emitting the light onto an inner central region of the multilayer structure, the inner central region being located radially inward relative to the outer annular region.

2. The planarization system of claim 1, wherein the positioning system is configured to provide a predetermined distance between the annular light source and the multilayer structure after the multilayer structure is released from the superstrate chuck.

3. The planarization system of claim 2, wherein the angle of the light emitting diodes and the predetermined distance are selected such that the light emitted by the annular light source reaches the outer annular region of the multilayer structure.

4. The planarization system of claim 3, wherein the angle is 30 to 60 degrees.

5. The planarization system of claim 3, wherein a ratio of the predetermined distance to a diameter of the superstrate is 1:8 to 1:30.

6. The planarization system of claim 1, wherein a ratio of the area of the inner central region to the area of the outer annular region is 5:1 to 20:1.

7. The planarization system of claim 1, wherein the outer annular region extends to an edge of the multilayer structure.

8. The planarization system of claim 1, further comprising an additional light source configured to emit light onto the inner central region of the multilayer structure.

9. The planarization system of claim 8, wherein the additional light source comprises an array of light emitting diodes configured to emit light in a direction parallel to a vertical axis.

10. The planarization system of claim 9, wherein the annular light source and the additional light source are each configured to emit light onto an intermediate region located between the inner central region and the outer annular region.

11. The planarization system of claim 10, wherein the intermediate region extends from the inner central region to the outer annular region.

12. The planarization system of claim 11, wherein a ratio of the area of the inner central region to the area of the intermediate region to the area of the outer annular region is 5:1:1 to 20:1:1.

13. The planarization system of claim 8, wherein the additional light source is disposed above the superstrate chuck.

14. The planarization system of claim 13, wherein the additional light source is located below the upper end of the planarization head.

15. The planarization system of claim 13, wherein the additional light source is located above the upper end of the planarization head.

16. The planarization system of claim 8, wherein the annular light source and the additional light source are configured to emit light at the same time to cure the film of formable material.

17. The planarization system of claim 8,
wherein a portion of the superstrate chuck overlaps a working surface of the superstrate, and
wherein the portion interferes with the light emitted from the additional light source.

18. The planarization system of claim 1,
wherein the holding portion of the superstrate chuck is flexible, and
wherein the annular light source is coupled to the flexible portion.

* * * * *